(12) United States Patent
De Winter et al.

(10) Patent No.: US 10,037,985 B2
(45) Date of Patent: Jul. 31, 2018

(54) COMPOUND MICRO-TRANSFER-PRINTED POWER TRANSISTOR DEVICE

(71) Applicant: X-Celeprint Limited, Cork (IE)

(72) Inventors: Rudi De Winter, Heusden-Zolder (BE); Christopher Bower, Raleigh, NC (US); Ronald S. Cok, Rochester, NY (US); Matthew Meitl, Durham, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/596,975

(22) Filed: May 16, 2017

(65) Prior Publication Data

US 2017/0338216 A1    Nov. 23, 2017

Related U.S. Application Data

(60) Provisional application No. 62/337,761, filed on May 17, 2016.

(51) Int. Cl.

| | | |
|---|---|---|
| *H01L 27/02* | (2006.01) | |
| *H01L 27/088* | (2006.01) | |
| *H01L 23/31* | (2006.01) | |
| *H01L 23/367* | (2006.01) | |
| *H01L 21/56* | (2006.01) | |
| *H01L 21/306* | (2006.01) | |
| *H01L 23/00* | (2006.01) | |

(52) U.S. Cl.
CPC ........ *H01L 27/0207* (2013.01); *H01L 21/306* (2013.01); *H01L 21/56* (2013.01); *H01L 23/3107* (2013.01); *H01L 23/367* (2013.01); *H01L 24/24* (2013.01); *H01L 24/82* (2013.01); *H01L 27/088* (2013.01); *H01L 2224/04105* (2013.01); *H01L 2224/18* (2013.01); *H01L 2224/73267* (2013.01)

(58) Field of Classification Search
CPC ... H01L 27/0207; H01L 21/306; H01L 21/56; H01L 23/3107; H01L 27/088; H01L 23/367

See application file for complete search history.

(56) References Cited

U.S. PATENT DOCUMENTS

| | | | | |
|---|---|---|---|---|
| 5,889,302 A | * | 3/1999 | Liu ...................... | H01L 21/8221 257/315 |
| 7,307,298 B2 | * | 12/2007 | Yamane ............. | H01L 21/8252 257/280 |
| 7,547,917 B2 | * | 6/2009 | Gauthier, Jr. ..... | H01L 21/76251 257/347 |
| 7,622,367 B1 | | 11/2009 | Nuzzo et al. | |

(Continued)

FOREIGN PATENT DOCUMENTS

JP    2009-081478 A    4/2009

*Primary Examiner* — William Coleman
(74) *Attorney, Agent, or Firm* — William R. Haulbrook; Bin Li; Choate, Hall & Stewart LLP

(57) ABSTRACT

Embodiments of the present invention provide a compound power transistor device including a first semiconductor substrate including a first semiconductor material, a second semiconductor substrate including a second semiconductor material different from the first semiconductor material, and a power transistor formed in or on the second semiconductor substrate. In certain embodiments, the second semiconductor substrate is micro-transfer printed on and secured to the first semiconductor substrate.

20 Claims, 8 Drawing Sheets

(56) References Cited

U.S. PATENT DOCUMENTS

| | | | |
|---|---|---|---|
| 8,394,116 B2 * | 3/2013 | Kota | A61B 17/1631 |
| | | | 606/167 |
| 8,506,867 B2 | 8/2013 | Menard | |
| 8,686,428 B1 * | 4/2014 | Sekar | H01L 21/8221 |
| | | | 257/173 |
| 8,722,458 B2 | 5/2014 | Rogers et al. | |
| 8,835,940 B2 * | 9/2014 | Hu | H01L 25/0753 |
| | | | 257/13 |
| 8,933,433 B2 * | 1/2015 | Higginson | H01L 23/3171 |
| | | | 257/13 |
| 9,520,537 B2 | 12/2016 | Bower et al. | |
| 9,741,906 B2 * | 8/2017 | Tischler | H01L 33/502 |
| 2004/0014299 A1 | 1/2004 | Moriceau et al. | |
| 2016/0093600 A1 | 3/2016 | Bower et al. | |
| 2016/0380154 A1 * | 12/2016 | Machuca | H01L 33/32 |
| | | | 257/99 |
| 2017/0048976 A1 | 2/2017 | Prevatte et al. | |

* cited by examiner

COMPOUND MICRO-TRANSFER-PRINTED POWER TRANSISTOR DEVICE

PRIORITY APPLICATION

This application claims priority to and benefit of U.S. Patent Application No. 62/337,761, filed May 17, 2016, entitled Compound Micro-Transfer-Printed Power Transistor Device, the content of which is hereby incorporated by reference in its entirety.

FIELD OF THE INVENTION

The present invention relates to integrated heterogeneous electronic power devices constructed using micro-transfer printing.

BACKGROUND OF THE INVENTION

Electronic circuits are widely used in communication and sensing devices. In particular, power transistors are found in many electronic devices. Such power transistors are larger than those typically found in logic circuits, have different frequency requirements, and are typically used in analog circuits. Furthermore, it is often desirable to use different materials for the power transistors than for logic circuits. In particular, logic circuits often use CMOS circuits constructed in silicon semiconductor materials. In contrast, other compound semiconductor materials, for example, gallium arsenide (GaAs) have a higher electron mobility than silicon and can therefore have higher performance for power applications.

In many electronic circuits, it is useful to integrate both logic and power transistors in a common package. If common materials are employed either the logic circuits are limited or the power transistors have lower performance. If different materials are used, conventional integration methods can be inconvenient or problematic. For example, forming a crystalline compound semiconductor layer (e.g., GaAs) on a silicon semiconductor substrate can be difficult. Alternatively, forming a compound semiconductor layer separate from a silicon substrate and then affixing the compound semiconductor layer to the silicon substrate requires a number of process steps. For example, a compound semiconductor layer can be formed on a native substrate and a handle substrate affixed to the side of the compound semiconductor layer opposite the native substrate. The native substrate is then removed, for example by grinding, and then the layer adhered to a semiconductor substrate. The handle substrate is then removed. The silicon and compound semiconductor layers can then be processed in common. Japanese Patent Publication No. JP2009-081478 describes such a process. However, the processes of grinding and handle substrate removal can be problematic or time consuming. Furthermore, there can be process steps that are best performed on each material separately.

Power transistors typically generate considerable amounts of heat and the management of that heat is often a challenge in systems using power transistors. Moreover, as the devices grow hotter, their performance can degrade.

There is a need, therefore, for improved structures and methods for integration of logic circuits and power transistors having different materials and for reducing or managing the heat generated by power transistors.

SUMMARY OF THE INVENTION

Embodiments of the present invention provide a compound power transistor device comprising a first semiconductor substrate including a first semiconductor material and a second semiconductor substrate including a second semiconductor material different from the first semiconductor material. A power transistor is formed in or on the second semiconductor substrate. The second semiconductor substrate is micro-transfer printed on and secured to the first semiconductor substrate. The power transistor or second semiconductor substrate can include a fractured tether and the power transistor can be formed on a side of the second semiconductor substrate opposite the first semiconductor substrate.

In some embodiments, a plurality of power transistors is formed in or on the second semiconductor substrate and are electrically connected in parallel. Alternatively, or in addition, a plurality of power transistors is formed in or on a corresponding plurality of second semiconductor substrates that are disposed on a common first semiconductor substrate and are electrically connected in parallel.

The first semiconductor substrate can include an electronic circuit, such as an integrated circuit, an active electronic circuit, or a CMOS electronic circuit. The first semiconductor substrate can also be micro-transfer printed onto a destination substrate.

In some embodiments, the first semiconductor substrate comprises silicon and the second semiconductor substrate comprises a compound semiconductor, a III-V semiconductor, or a GaAs semiconductor.

In some embodiments, one or more electrically conductive connection posts protrude from a side of the second semiconductor substrate and are electrically connected to the power transistor. One or more electrical connection pads are disposed on the first semiconductor substrate and each connection posts can be electrically connected to a connection pad. Likewise, an electronic circuit is formed in or on the first semiconductor substrate and one or more electrically conductive connection posts protrude from a side of the first semiconductor substrate and are electrically connected to the electronic circuit. The first semiconductor substrate or compound power transistor device can be disposed on a destination substrate with one or more connection pads so that the connection posts are electrically connected to the destination substrate connection pads.

In certain embodiments, a power transistor source wafer includes a wafer of substrate material, a patterned sacrificial layer formed on or in the substrate material, the patterned sacrificial layer defining separate anchors between sacrificial portions of the sacrificial layer, and a power transistor or a power transistor device including at least one power transistor formed over each sacrificial portion and attached to the anchors by tethers over the sacrificial portion. In certain embodiments, a method of making a power transistor source wafer includes providing a wafer of substrate material; forming or designating a patterned sacrificial layer formed on or in the substrate material, the patterned sacrificial layer defining one or more separate anchors between one or more sacrificial portions of the sacrificial layer; disposing a power transistor or a power transistor device comprising at least one power transistor over each sacrificial portion; and forming one or more tethers, so that each tether of the one or more tethers exclusively attaches an anchor of the one or more separate anchors to a power transistor or power transistor device.

In certain embodiments, a compound power transistor device wafer includes a wafer of first substrate material, a patterned sacrificial layer formed on or in the first substrate material, the patterned sacrificial layer defining separate anchors between sacrificial portions of the sacrificial layer, and a micro-transfer printed power transistor or power transistor device disposed over each sacrificial portion and attached to the anchors by tethers over the patterned sacrificial layer. A method of making a compound power transistor device wafer includes providing a power transistor source wafer, providing a first semiconductor substrate having a patterned sacrificial layer formed on or in the substrate material, the patterned sacrificial layer defining separate anchors between sacrificial portions of the sacrificial layer, and micro-transfer printing at least one of the power transistors or power transistor devices from the power transistor source wafer to the semiconductor substrate or to a layer formed on or over the semiconductor substrate over a sacrificial portion.

In certain embodiments, a power transistor system includes a destination substrate and a compound power transistor device micro-transfer printed onto the destination substrate or layers formed on or over the destination substrate. A method of making a power transistor system includes providing a destination substrate and micro-transfer printing a compound power transistor device from a compound power transistor device wafer onto the destination substrate or layers formed on or over the destination substrate.

In some embodiments, a power transistor system includes a destination substrate and one or more power transistor devices micro-transfer printed onto the destination substrate or layers formed on or over the destination substrate. A method of making a power transistor system includes providing a destination substrate and micro-transfer printing a power transistor device from a power transistor device wafer to the destination substrate or layers formed on or over the destination substrate.

In certain embodiments, the power transistor comprises an encapsulation layer formed on a side of the layers forming the power transistor opposite the power transistor substrate or formed on a side of the layers forming the power transistor that is substantially non-parallel to the surface of the semiconductor substrate on which the power transistor is micro-transfer printed. In certain embodiments, the encapsulation layer comprises at least a portion of a tether or is chemically etch-resistant. In certain embodiments, the second semiconductor substrate is chemically etch-resistant and comprises at least a portion of a tether. In certain embodiments, the one or more layers in or on the first or second semiconductor substrates comprises one or more of an electrical insulator, a patterned electrical insulator, a dielectric layer, a patterned dielectric layer, an electrical conductor, or a patterned electrical conductor. In certain embodiments, the first semiconductor substrate includes an active electronic circuit comprising active elements electrically connected to the power transistor with electrical conductors on the semiconductor substrate. In some embodiments, the active electronic circuit controls the power transistor. In certain embodiments, the active elements comprise CMOS transistors.

In some embodiments of the present invention, a compound semiconductor source wafer comprises a wafer of semiconductor material, wherein the semiconductor material is a compound semiconductor, the wafer having a patterned sacrificial layer of the semiconductor material, the patterned sacrificial layer defining separate anchors between sacrificial portions of the sacrificial layer, and a device including the semiconductor material formed over each sacrificial portion and attached to the anchors by one or more tethers over the sacrificial portion. The device can be a device for generating, controlling or responding to electricity, a device for generating, controlling, or responding to magnetism or magnetic fields, or a device for generating, controlling, or responding to an electrical field. The device can be a power transistor and the compound semiconductor can be GaAs or InP.

The present invention provides advantages over power transistor assemblies of the prior art. According to embodiments of the present invention, a plurality of very small high-performance power transistors is connected in parallel to spatially distribute unwanted heat generation and improve electrical operating efficiency. This reduces the amount of wasted power transistor material. Furthermore, by micro-transfer printing the power transistors, made in a semiconductor material optimized for power transistors such as a compound semiconductor, onto a substrate of different semiconductor material, for example a silicon semiconductor optimized for control logic or integrated circuits, an integrated structure with materials chosen to optimize different tasks is provided. Furthermore, multiple power transistors can be provided without requiring multiple, sequential deposition and patterning of power transistor layers, greatly reducing the time required to make the integrated component. Moreover, different processes optimized for different materials can be used to make the various power transistors and the semiconductor substrate, improving their performance.

Embodiments of the present invention therefore enable compound power transistor devices comprising a variety of different heterogeneous materials that can each be processed or assembled separately using different, possibly incompatible, processes and at higher densities, thereby reducing costs and improving performance. By micro-transfer printing multiple, different power transistors onto a substrate having logic or control circuits, manufacturing cycle time and costs are reduced and higher performance enabled in a more highly integrated device with a smaller size.

In one aspect, the disclosed technology includes a compound power transistor device, including: a first semiconductor substrate including a first semiconductor material; a second semiconductor substrate including a second semiconductor material different from the first semiconductor material; and a power transistor formed in or on the second semiconductor substrate; wherein the second semiconductor substrate is micro-transfer printed on and secured to the first semiconductor substrate.

In certain embodiments, the second semiconductor substrate includes a fractured tether or comprising a layer or structure formed on the second semiconductor substrate that includes a fractured tether.

In certain embodiments, compound power transistor device includes a layer of adhesive between the second semiconductor substrate and the first semiconductor substrate to adhere the power transistor to the first semiconductor substrate.

In certain embodiments, the power transistor is formed in or on a side of the second semiconductor substrate opposite the first semiconductor substrate.

In certain embodiments, the compound power transistor device includes a plurality of power transistors formed in or on the second semiconductor substrate, or comprising a plurality of second semiconductor substrates, and one or more power transistors formed in or on each second semiconductor substrate wherein the power transistors are electrically connected in parallel.

In certain embodiments, all of the plurality of power transistors formed in or on the second semiconductor substrate are substantially or effectively the same size.

In certain embodiments, at least two of the plurality of power transistors formed in or on the second semiconductor substrate have different sizes.

In certain embodiments, the compound power transistor device includes an electronic circuit, an integrated circuit, an active electronic circuit, or a CMOS electronic circuit formed in or on the first semiconductor substrate.

In certain embodiments, the electronic circuit is electrically connected to the power transistor or wherein the electronic circuit is a control circuit or includes a gate pre-drive circuit.

In certain embodiments, the first semiconductor substrate includes a fractured tether or comprising a layer or structure formed on the first semiconductor substrate that includes a fractured tether.

In certain embodiments, the second semiconductor substrate has an extent over the first semiconductor substrate that is smaller than the first semiconductor substrate.

In certain embodiments, the compound power transistor device includes an encapsulation layer formed at least partially on or over the second semiconductor substrate and on a side of the second semiconductor substrate that is substantially non-parallel to the surface of the first semiconductor substrate.

In certain embodiments, the encapsulation layer extends at least partially on or over the first semiconductor substrate.

In certain embodiments, the encapsulation layer comprises at least a portion of a tether.

In certain embodiments, the encapsulation layer is chemically etch-resistant.

In certain embodiments, the first semiconductor substrate comprises one or more layers formed on, in, or over the first semiconductor material and between the first semiconductor material and the second semiconductor substrate.

In certain embodiments, the one or more layers comprises one or more of an electrical insulator, a patterned electrical insulator, a dielectric, a patterned dielectric, an electrical conductor, a patterned electrical conductor, a transistor, a resistor, a capacitor, or a diode.

In certain embodiments, the first semiconductor substrate comprises silicon and the second semiconductor substrate comprises a compound semiconductor, a III-V semiconductor, or a GaAs semiconductor.

In certain embodiments, the compound power transistor device includes a plurality of second semiconductor substrates, each second semiconductor substrates including a second semiconductor material different from the first semiconductor material and a power transistor formed in or on the second semiconductor substrate; and wherein each second semiconductor substrate is micro-transfer printed on and secured to the first semiconductor substrate.

In certain embodiments, the power transistors formed in or on the second semiconductor substrates are electrically connected in parallel.

In certain embodiments, the compound power transistor device includes an electrical connection pad on the first semiconductor substrate and one or more electrically conductive connection posts protruding from a side of the second semiconductor substrate electrically connected to the power transistor wherein the connection posts are electrically connected to the connection pad.

In certain embodiments, the compound power transistor device includes an electronic circuit formed in or on the first semiconductor substrate and one or more electrically conductive connection posts protruding from a side of the first semiconductor substrate electrically connected to the electronic circuit.

In certain embodiments, the compound power transistor device includes a heat spreader in thermal contact with the first or second semiconductor substrates.

In another aspect, the disclosed technology includes a power transistor source wafer, including: a wafer of substrate material; a patterned sacrificial layer formed on or in the substrate material, the patterned sacrificial layer defining separate anchors between sacrificial portions of the sacrificial layer; and at least one power transistor or power transistor device formed over each sacrificial portion and attached to the anchors by one or more tethers over the sacrificial portion.

In certain embodiments, the power transistor device comprises a plurality of power transistors, the power transistors electrically connected in parallel. In another aspect, the disclosed technology includes method of making a power transistor source wafer, comprising: providing a wafer of substrate material; forming or designating a patterned sacrificial layer formed on or in the substrate material, the patterned sacrificial layer defining one or more separate anchors between one or more sacrificial portions of the sacrificial layer; disposing a power transistor or a power transistor device comprising at least one power transistor over each sacrificial portion; and forming one or more tethers, so that each tether of the one or more tethers exclusively attaches an anchor of the one or more separate anchors to a power transistor or power transistor device.

In certain embodiments, the step of forming the one or more tethers comprises etching the sacrificial portions.

In certain embodiments, the method includes providing a device substrate on which the at least one power transistor is formed or providing an encapsulation layer over the power transistor.

In certain embodiments, the device substrate or encapsulation layer form at least a portion of a tether or wherein a tether comprises a portion of the device substrate or encapsulation layer.

In another aspect, the disclosed technology includes compound power transistor device source wafer, including: a wafer of substrate material; a patterned sacrificial layer formed on or in the substrate material, the patterned sacrificial layer defining separate anchors between sacrificial portions of the sacrificial layer; and a micro-transfer printable power transistor or power transistor device disposed over each sacrificial portion and attached to the anchors by one or more tethers over the patterned sacrificial layer.

In certain embodiments, the compound power transistor device source wafer includes a plurality of micro-transfer printable power transistors disposed over a common sacrificial portion.

In certain embodiments, the power transistors are electrically connected in parallel.

In certain embodiments, each micro-transfer printable power transistor device includes a fractured tether.

In certain embodiments, the compound power transistor device source wafer includes an encapsulation layer formed over the power transistor and wherein the encapsulation layer forms at least a portion of the tethers.

In another aspect, the disclosed technology includes a method of making a compound power transistor device source wafer, including: providing a power transistor source wafer having a power transistor or power transistor device in accordance with some embodiments described above; providing a first semiconductor substrate having a patterned sacrificial layer formed on or in the substrate material, the patterned sacrificial layer defining separate anchors between sacrificial portions of the sacrificial layer; and micro-transfer printing at least one of the power transistors or power transistor devices from the power transistor source wafer to the first semiconductor substrate or to a layer formed on or over the first semiconductor substrate over a sacrificial portion.

In certain embodiments, the method includes etching the sacrificial portions to form one or more tethers connecting the compound power transistor device to the anchor.

In certain embodiments, the method includes forming a circuit on or in the first semiconductor substrate.

In certain embodiments, the method includes electrically connecting the circuit to the power transistor.

In certain embodiments, the method includes micro-transfer printing the power transistors onto or over at least a portion of the circuit.

In certain embodiments, the method includes etching the sacrificial portions to form one or more tethers connecting the compound power transistor device to the anchor.

In certain embodiments, the method includes providing a device substrate on which the at least one power transistor is micro-transfer printed or providing an encapsulation layer over the power transistor.

In certain embodiments, the device substrate or encapsulation layer form at least a portion of a tether or wherein a tether comprises a portion of the device substrate or encapsulation layer.

In another aspect, the disclosed technology includes a compound power transistor system, including: a destination substrate; and a compound power transistor device (e.g., according to an embodiment described above) that is micro-transfer printed onto the destination substrate or layers formed on or over the destination substrate.

In another aspect, the disclosed technology includes a method of making a compound power transistor system, including: providing a destination substrate; and micro-transfer printing a compound power transistor device from a compound power transistor device wafer according to some embodiments above onto the destination substrate or layers formed on or over the destination substrate.

In another aspect, the disclosed technology includes a power transistor system, including: a destination substrate; and one or more power transistors having connection posts micro-transfer printed onto the destination substrate or layers formed on or over the destination substrate.

In another aspect, the disclosed technology includes a method of making a power transistor system, including: providing a destination substrate; and micro-transfer printing a power transistor device from a power transistor device source wafer according to some embodiments above to the destination substrate or layers formed on or over the destination substrate.

In another aspect, the disclosed technology includes a compound semiconductor source wafer, including: a wafer of semiconductor material, wherein the semiconductor material is a compound semiconductor, the wafer having a patterned sacrificial layer of the compound semiconductor material, the patterned sacrificial layer defining separate anchors between sacrificial portions of the sacrificial layer; and a device formed over each sacrificial portion and attached to the anchors by one or more tethers over the sacrificial portion.

In certain embodiments, the device includes the compound semiconductor material.

In certain embodiments, at least one of the following is true: the device is a device for generating, controlling or responding to electricity; a device for generating, controlling, or responding to magnetism or magnetic fields; and a device for generating, controlling, or responding to an electrical field.

In certain embodiments, the device is a power transistor.

In certain embodiments, the compound semiconductor is GaAs or InP.

In certain embodiments, the power transistor device is a radio frequency transistor.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1A:
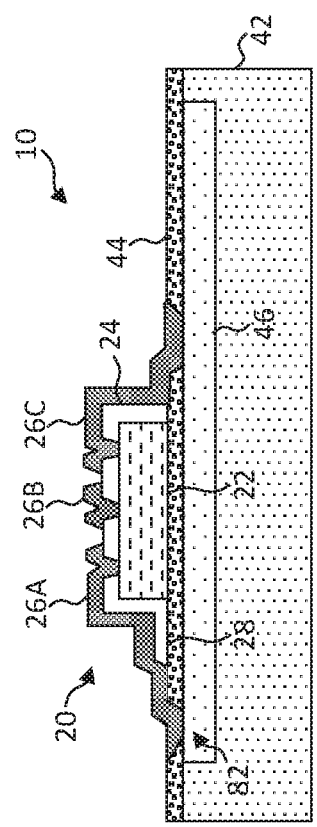
FIG. 1A is a cross section of an illustrative embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 1B:
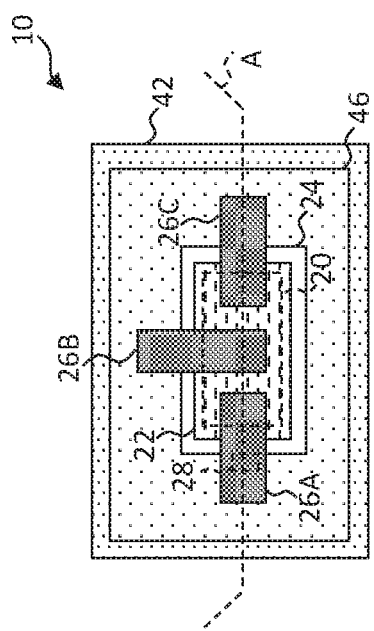
FIG. 1B is a plan view of an illustrative embodiment of the present invention corresponding to FIG. 1A.

FIG. 1B is a plan view and FIG. 1A is a cross section taken across cross-section line A of FIG. 1B of an illustrative embodiment of the present invention. In this embodiment, a compound power transistor device 10 includes a first semiconductor substrate 42 including a first semiconductor material. A second semiconductor substrate 22 includes a second semiconductor material different from the first semiconductor material. A power transistor 20 is formed in or on the second semiconductor substrate 22. For example, doped semiconductor areas, conductors, and insulators are formed on or in the second semiconductor substrate 22 using photolithographic processes and materials. The power transistor 20 can be formed in or on a side of the second semiconductor substrate 22 opposite the first semiconductor substrate 42 (a top side) and electrically connected to first, second, and third electrodes 26A, 26B, and 26C (collectively electrodes 26) on the top side. The electrodes 26 can be insulated from the second semiconductor substrate 22 with a patterned insulator or dielectric layer 24 that can also be an encapsulation layer 24, or partial encapsulation layer, as shown, with vias for the electrical connections between the electrodes 26 and the power transistor 20. The second semiconductor substrate 22 (and power transistor 20) can be micro-transfer printed on and secured to the first semiconductor substrate 42, for example by adhering the bottom side of the second semiconductor substrate 22 opposite the top side to the first semiconductor substrate 42. The second semiconductor substrate 22 can also be considered a power transistor substrate 22.

In some embodiments, the second semiconductor substrate 22 includes a fractured tether 28. The fractured tether 28 can include a layer or structure formed on the second semiconductor substrate 22 that includes a fractured tether 28, for example the encapsulation or dielectric layer 24. Alternatively, the second semiconductor material forms the fractured tether 28.

As shown in the embodiment of FIG. 1A, the second semiconductor substrate 22 is adhered to the first semiconductor substrate 42 with a layer 44 of adhesive between the second semiconductor substrate 22 and the first semiconductor substrate 42 to adhere the power transistor 20 to the first semiconductor substrate 42. The adhesive layer 44 can be patterned and the second semiconductor substrate 22 can be smaller than the first semiconductor substrate 42 so that the second semiconductor substrate 22 has an extent over the first semiconductor substrate 42 that is smaller than the first semiconductor substrate 42.

In the embodiment of FIGS. 1A and 1B, the compound power transistor device 10 includes an electronic circuit 46, such as an integrated circuit, an active electronic circuit, or a CMOS electronic circuit formed in or on the first semiconductor substrate 42. The electronic circuit 46 can be electrically connected to the power transistor 20 through the first, second, and third electrodes 26A, 26B, and 26C, for example through vias 82 formed in the adhesive layer 44 or any other layers between the first semiconductor substrate 42 and the second semiconductor substrate 22.

The first semiconductor material can be crystalline silicon semiconductor, the second semiconductor material can be a compound semiconductor, such as a III/V semiconductor such as GaAs, the adhesive layer 44 can be a curable resin, the dielectric 24 can be an oxide or nitride such as silicon oxide or silicon nitride. The dielectric layer 24 can at least partially encapsulate the power transistor 20. The electrodes 26 can be a metal such as aluminum, tungsten, titanium, tin, tantalum, silver, copper, or gold. In some embodiments, the electrodes 26 are a highly heat conductive metal, for example copper. The dielectric layer 24 and electrodes 26 can be patterned using photolithographic and integrated circuit methods and the adhesive layer 44 can be coated, for example spin or curtain coated, or laminated on the first semiconductor substrate 42 or layers on the first semiconductor substrate 42. Crystalline silicon and compound semiconductor substrates and structures, such as transistor structures, can also be formed using integrated circuit manufacturing methods.

In one embodiment of the present invention, the power transistors are radio frequency (RF) transistors and the compound power transistor device 10 can be used for power amplifiers in mobile devices or in automotive applications.

Figure 2:
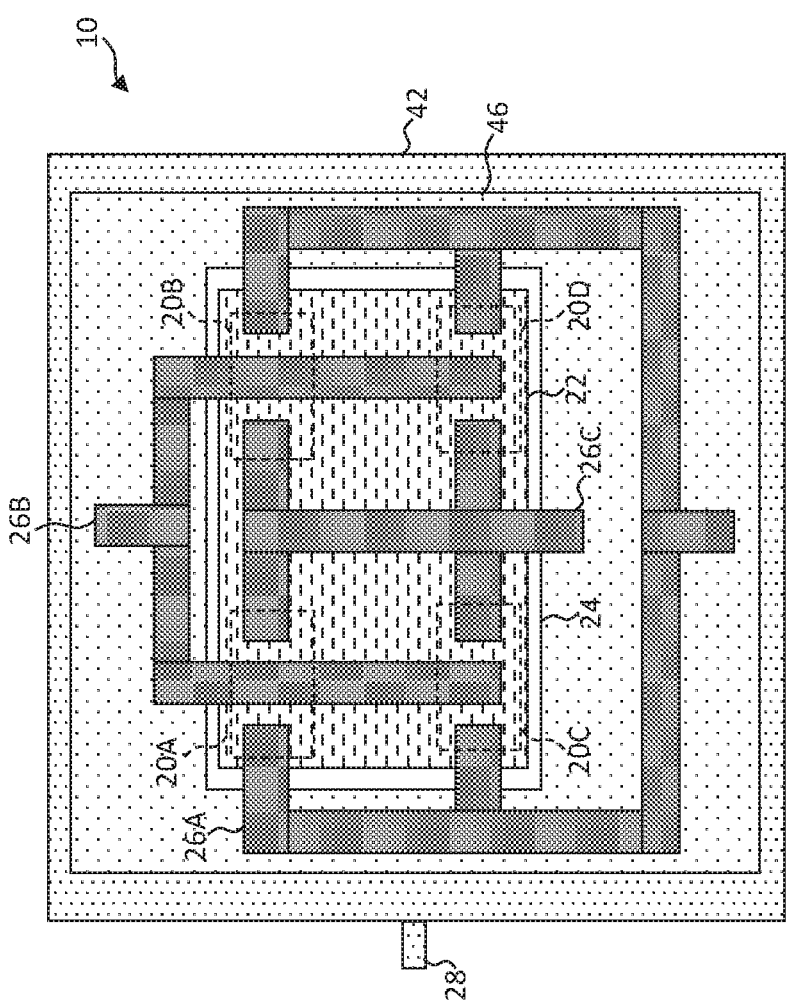
FIG. 2 is a plan view of an illustrative embodiment of the present invention.

Referring next to FIG. 2, in some embodiments of the present invention, the compound power transistor device 10 can include a plurality of power transistors 20A, 20B, 20C, 20D (collectively power transistors 20) formed in or on the second semiconductor substrate 22 with a patterned dielectric layer 24. In this embodiment, the power transistors 20 are all formed on a common second semiconductor substrate 22. As shown in FIG. 2, four power transistors 20A, 20B, 20C, 20D are formed in a mirrored arrangement on the second semiconductor substrate 22 with the first, second, and third electrodes 26A, 26B, and 26C of the power transistors 20 electrically connected in parallel, for example on or over the second semiconductor substrate 22 or dielectric layers 24 on or over the second semiconductor substrate 22. Furthermore, the electrodes 26 can be connected to the electronic circuit 46 on or in the first semiconductor substrate 42, for example as illustrated in FIG. 1A.

Figure 3:
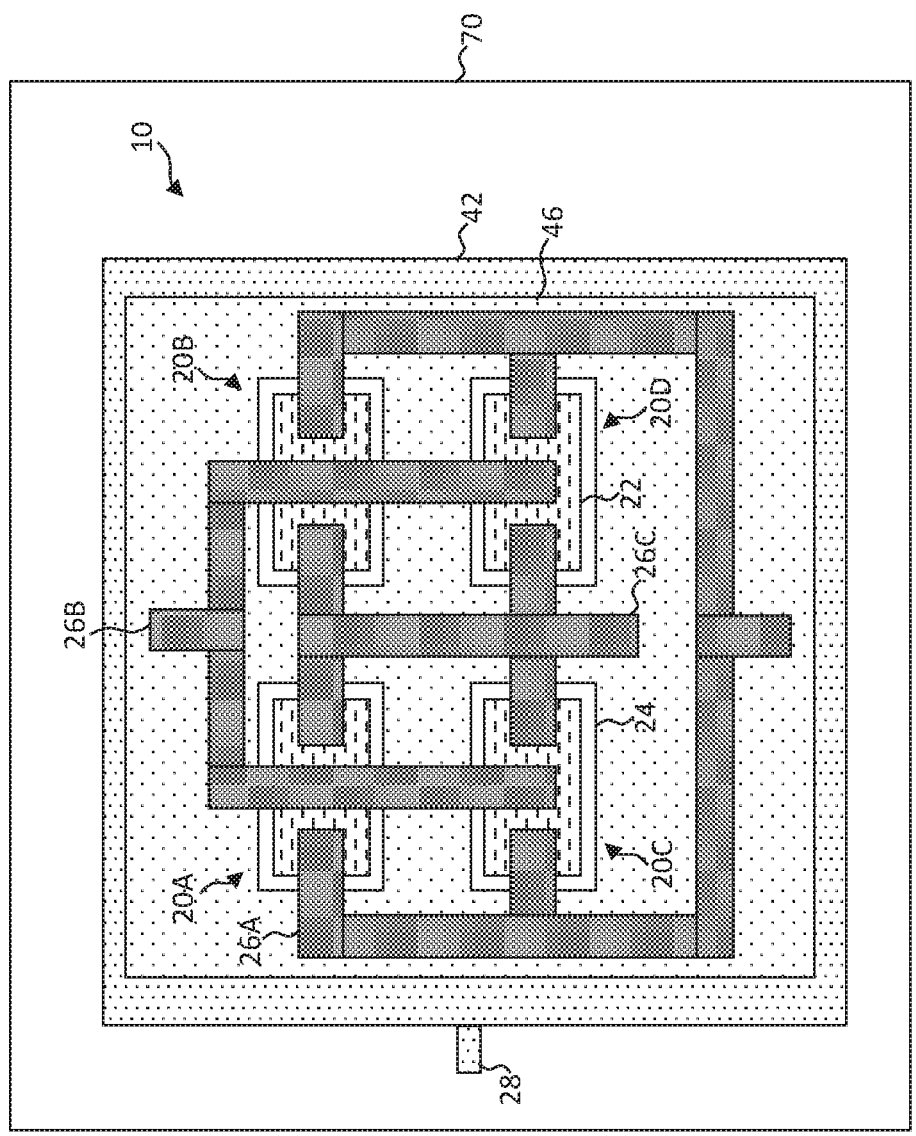
FIG. 3 is a plan view of another illustrative embodiment of the present invention.

An alternative illustrative embodiment of the compound power transistor device 10 having multiple power transistors 20 is shown in FIG. 3. Referring to FIG. 3, the compound power transistor device 10 includes a plurality of power transistors 20A, 20B, 20C, 20D (collectively power transistors 20) and a corresponding plurality of second semiconductors 22. Each power transistor 20 is formed in or on a separate second semiconductor substrate 22 with a patterned dielectric layer 24. In some embodiments, one or more of the second semiconductors 22 has two or more power transistors 20, for example combining the embodiments of FIGS. 2 and 3. The first, second, and third electrodes 26A, 26B, and 26C of the power transistors 20 are electrically connected in parallel, for example connected in parallel with electrodes 26 at least partly located on the first semiconductor substrate 42, or dielectric layers 24 formed on or over the first semiconductor substrate 42. The electrodes 26 can also be connected to the electronic circuit 46 on or in the first semiconductor substrate 42, for example as illustrated in FIG. 1A.

As shown in FIGS. 2 and 3, the power transistors 20 are all substantially the same size, for example within 10%. In alternative embodiments, at least two of the plurality of power transistors 20 formed in or on the second semiconductor substrate 22 or on different second semiconductor substrates 22 have different sizes, for example having a difference in size greater than or equal to 10%, 50%, 100%, or 200%.

As shown in FIGS. 1A and 1B, the second semiconductor substrate 22 has a fractured tether 28 as a consequence of micro-transfer printing. In some embodiments, and as shown in FIGS. 2 and 3, the first semiconductor substrate also includes a fractured tether 28 or includes a layer or structure (for example a portion of an encapsulation or dielectric layer 24) formed on the first semiconductor substrate 42 that includes a fractured tether 28 and can be micro-transfer printed, for example onto a destination substrate 70 (FIG. 3), for example a glass or plastic substrate.

Figure 4:
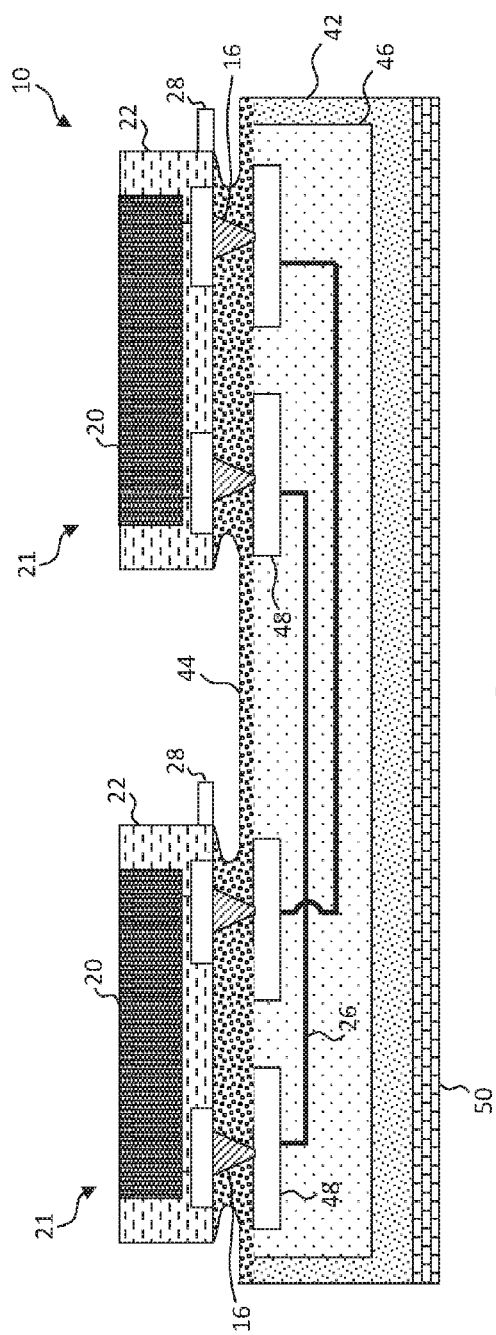
FIG. 4 is a cross section of an illustrative embodiment of the present invention.

Referring to FIG. 4, in some embodiments of the present invention, the compound power transistor device 10 can include one or more electrical connection pads 48 on the first semiconductor substrate 42. The connection pads 48 can also be described as contact pads. The power transistor 20 can be electrically connected to the connection pads 48 using conventional lithographically formed patterned wires. Alternatively, and as shown in FIG. 4, one or more electrically conductive connection posts 16 protrudes from a side of the second semiconductor substrate 22. Each electrical connection post 16 is electrically connected to the power transistor 20 with electrical connections to form a power transistor device 21 and is electrically connected to a connection pad 48, for example by using micro-transfer printing. A power transistor device 21 is a power transistor 20 formed on or in a second semiconductor substrate with electrodes 26 optionally connecting the power transistor 20 to connection posts 16. In certain embodiments, a compound power transistor device 10 further includes the first semiconductor substrate 42 and optional electronic circuit 46. In some embodiments of the present invention, an electronic circuit 46 is formed in or on the first semiconductor substrate 42 and one or more of the electrically conductive connection posts 16 protruding from a side of the second semiconductor substrate 22 is electrically connected to the electronic circuit 46. The connection posts 16 and connection pads 48 provide an electrical connection between an electronic circuit 46, for example a control or power circuit, and the power transistors 20. The electronic circuit 46 can, for example, include gate pre-drivers for the power transistors 20.

In some embodiment, an optional heat spreader 50 is disposed on a side of the first semiconductor substrate 42 opposite the power transistor devices 21, as shown, or elsewhere. The heat spreader 50 can be in thermal contact with the first semiconductor substrate 42 or the second semiconductor substrate 22. The heat spreader 50 further diffuses the heat created by operating the power transistor devices 21 and reduces the maximum temperature in the compound power transistor devices 10. Such heat spreaders 50 can be, for example, metal, and can be deposited and optionally patterned using photolithographic materials and methods.

Figure 5:
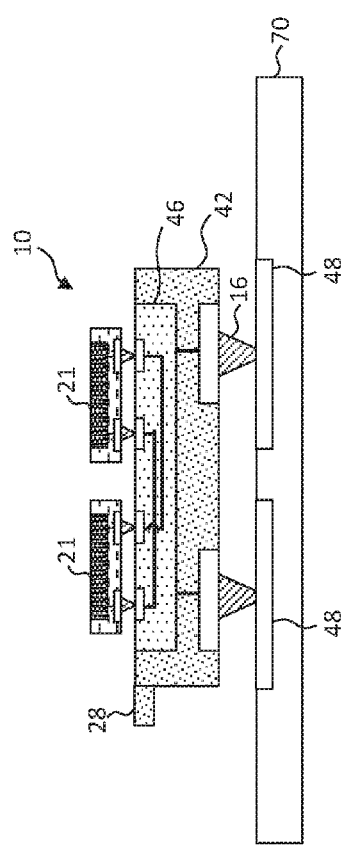
FIG. 5 is a cross section of an alternative illustrative embodiment of the present invention.

As shown further in FIG. 5, the first semiconductor substrate 42 can also or instead have one or more electrically conductive connection posts 16 protruding from a side of the first semiconductor substrate 42. The connection posts 16 are electrically connected to the electronic circuit 46. In this embodiment, the first semiconductor substrate 42 can be electrically connected to connection pads 48 on a destination substrate 70 to which the compound power transistor device 10 is affixed or adhered. The destination substrate 70 can be the substrate of a device that uses or includes one or more compound power transistor devices 10. As in FIG. 4, an adhesive layer 44 can be disposed between the first and second semiconductor substrate 42, 22 and another adhesive layer 44 can be disposed between the first semiconductor substrate 42 and the destination substrate 70. Adhesive layer 44 is shown in FIG. 4 and not shown in FIG. 5.

Figure 6:
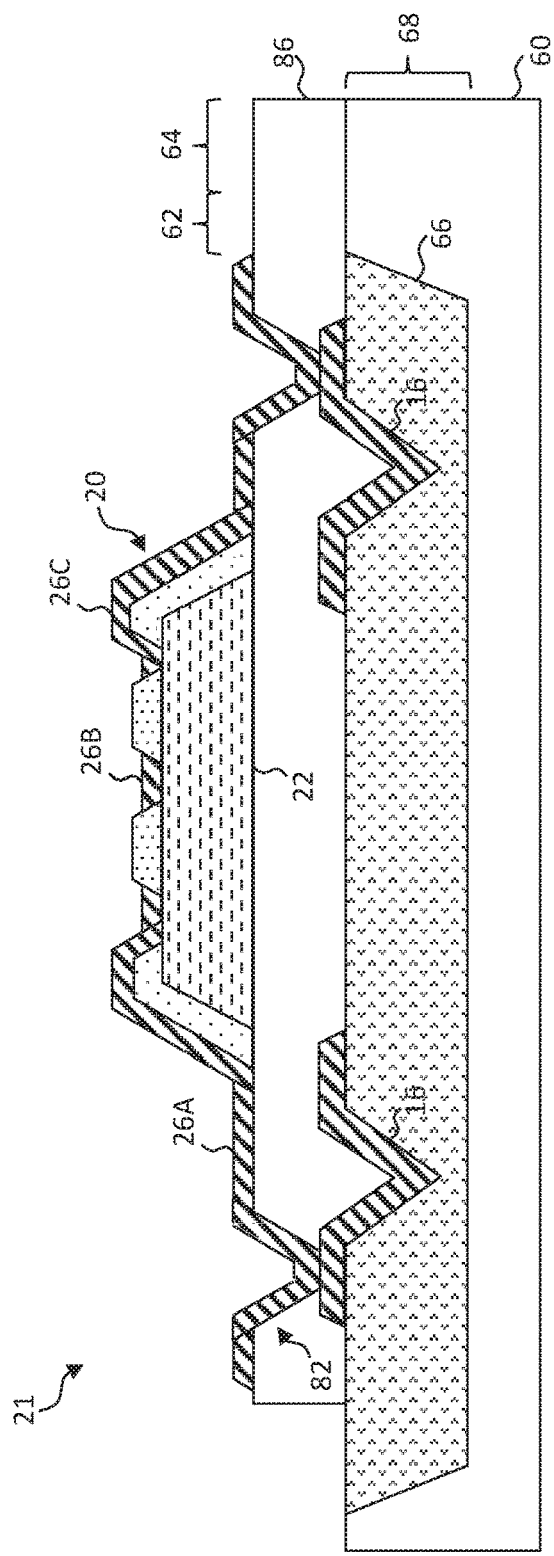
FIG. 6, FIG. 7, and FIG. 8 are cross sections of wafer portions in various embodiments of the present invention.

Referring to FIG. 6, power transistors 20 or power transistor devices 21 can be formed in a power transistor source wafer 60 that includes a wafer of substrate material having a patterned sacrificial layer 68 that is formed on or in the substrate material or that is a designated portion of the substrate material. A power transistor source wafer 60 can be a source wafer for either power transistors 20 or power transistor devices 21 that include a power transistor 20. The power transistors 20 can be electrically connected to the connection posts 16 with the electrodes (e.g., electrodes 26A, 26B, 26C). The patterned sacrificial layer 68 defines separate anchors 64 between sacrificial portions 66 of the patterned sacrificial layer 68. The power transistor device 21 includes at least one power transistor 20 formed over each sacrificial portion 66 and attached to the anchors 64 by one or more tethers 62 over the sacrificial portion 66. The power transistor device 21 can include a plurality of power transistors 20 electrically connected in parallel and can include connection posts 16 electrically connected to the one or more power transistors 20 with electrodes 26A, 26B, 26C (collectively electrodes 26). The second semiconductor substrate 22 can be disposed on a substrate 86, for example an oxide or nitride layer such as silicon dioxide or silicon nitride, and the substrate 86 can be the tether 62 or a portion of the tether 62. Alternatively or in addition, the tether 62 can be a portion of the second semiconductor substrate 22. Electrical connections can be made through a via 82 in the substrate 86 to the connection posts 16 from the electrodes 26.

Figure 7:
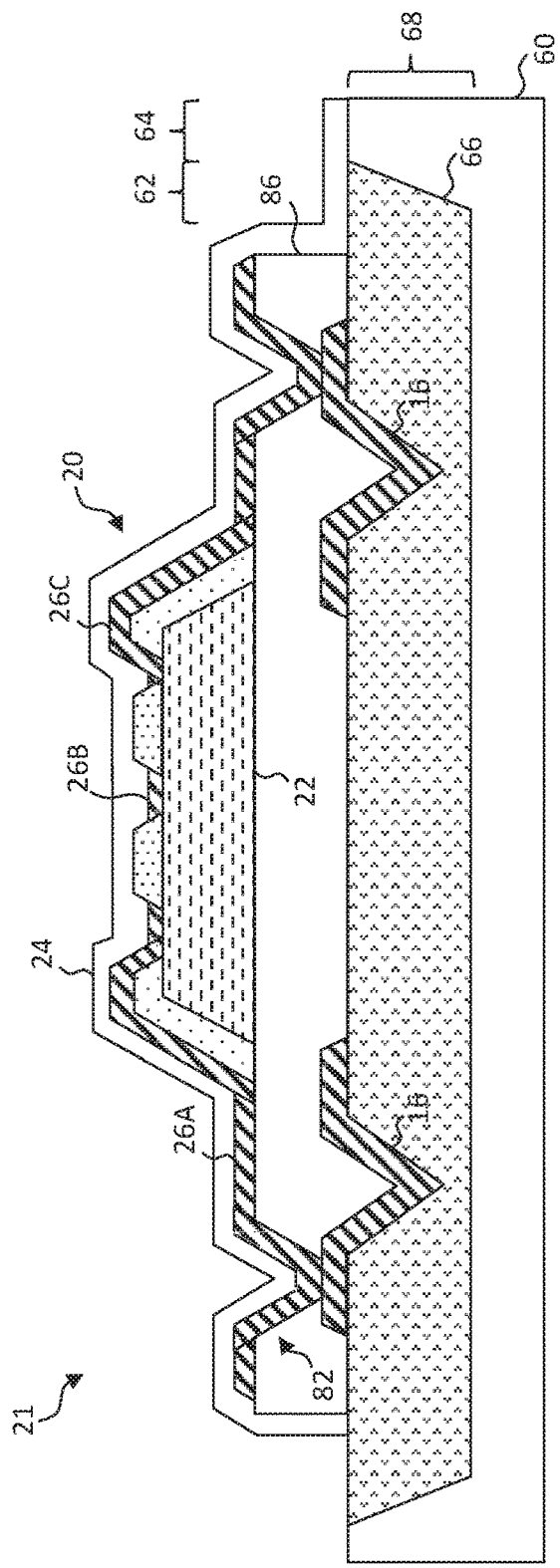

As shown in an illustrative embodiment in FIG. 7, the power transistor device 21 of FIG. 7 includes an encapsulation layer 24 formed at least partially on or over the second semiconductor substrate 22 and on a side of the second semiconductor substrate 22 that is substantially non-parallel to the surface of the first semiconductor substrate 42. In a some embodiments, the encapsulation layer 24 can extend at least partially on or over the first semiconductor substrate 42. Moreover, the encapsulation layer 24 can comprise at least a portion of the tether 62, as shown. In such some embodiments, it is useful if the encapsulation layer 24 is chemically etch-resistant or differentially etch resistant with respect to any material of the sacrificial portion 66. Furthermore, the first semiconductor substrate 42 can comprise one or more layers formed on, in, or over the first semiconductor material and between the first semiconductor material and the second semiconductor substrate 22, for example the substrate 86, an encapsulating layer, a planarization layer, or a differentially etchable layer.

As shown in FIGS. 6 and 7, the power transistor device 21 includes connection posts 16 electrically connected to the power transistor 20 through the first, second, and third electrodes 26A, 26B, 26C. Such a structure can be constructed, according to a method of the present invention, by providing a wafer of substrate material, forming a patterned sacrificial layer 68 on or in the substrate material, the patterned sacrificial layer 68 defining separate anchors 64 between sacrificial portions 66 of the patterned sacrificial layer 68, and disposing a power transistor 20 or power transistor device 21 including at least one power transistor 20 formed over each sacrificial portion 66 and attached to the anchors 64 by one or more tethers 62 over the sacrificial portion 66. The encapsulation layer 24 (FIG. 7) can be formed by providing dielectric materials, such as oxides or nitrides over the power transistor 20 and electrodes 26 and can make up at least a portion of the tethers 62. The tethers 62 can be formed by etching the sacrificial portions 66 to form one or more tethers 62 connecting the power transistor 20 or power transistor device 21 to the anchor 64, thereby providing a power transistor device 21 that can be micro-transfer printed to another substrate, for example a destination substrate 70 or a surface of the first semiconductor substrate 42. Micro-transfer printing is accomplished by contacting the power transistor 20 or power transistor device 21 with a stamp to fracture the tether 62 and adhere the power transistor 20 or power transistor device 21 to the stamp. The stamp and power transistor 20 or power transistor device 21 are then transported to a destination substrate 70 or first semiconductor substrate 42 and the power transistor 20 or power transistor device 21 are contacted to the destination substrate 70 to adhere the power transistor 20 or power transistor device 21 to the destination substrate 70. The stamp is then removed. The sacrificial portion 66 of the second semiconductor substrate 22 can be a designated portion of an anisotropically etchable crystal, such as a crystalline semiconductor or a crystalline compound semiconductor, a portion that is differentially etchable from the second semiconductor materials or the power transistor source wafer 60, for example an oxide or nitride material, or a gap between the second semiconductor substrate 22 and the power transistor source wafer 60.

Figure 8:
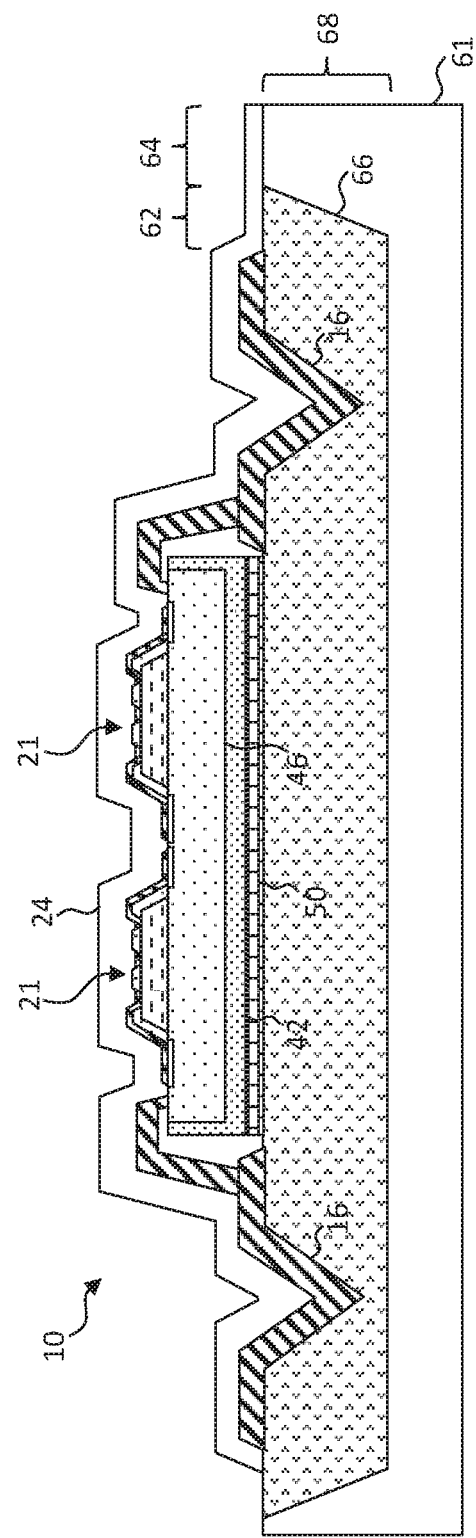

Referring to FIG. 8, a compound power transistor device source wafer 61 includes a wafer of substrate material, for example the first semiconductor material or another substrate material, and a patterned sacrificial layer 68 formed on or in the substrate material. The patterned sacrificial layer 68 defines separate anchors 64 between sacrificial portions 66 of the patterned sacrificial layer 68. One or more micro-transfer printed power transistors 20 or power transistor devices 21, each including at least one power transistor 20, are disposed over each sacrificial portion 66 and attached to the anchors 64 by one or more tethers 62 over the patterned sacrificial layer 68. Each micro-transfer printed power transistor device 21 can include a fractured tether 28 (shown in FIG. 1A). Each micro-transfer printed power transistor 20 or power transistor device 21 can include an encapsulation layer 24 formed over the power transistor 20 and the encapsulation layer 24 can form at least a portion of the tether 62 of the power transistor device 21 or power transistor 20.

In some embodiments of the present invention, the compound power transistor device source wafer 61 includes a plurality of micro-transfer printed power transistors 20 or power transistor devices 21 disposed over a common sacrificial portion 66 of the wafer of substrate material. The power transistors 20 can be electrically connected in parallel.

As shown in FIG. 8, the compound power transistor device 10 can include connection posts 16 electrically connected to the electronic circuit 46. Such a structure can be constructed, according to a method of the present invention, by providing a power transistor source wafer 60 and providing a first semiconductor substrate 42 having a patterned sacrificial layer 68 formed on or in the substrate material, the patterned sacrificial layer 68 defining separate anchors 64 between sacrificial portions 66 of the patterned sacrificial layer 68. In a some embodiments of the present invention, a heat spreader 50 is provided. The heat spreader 50 can be on a side of the first semiconductor substrate 42 opposite the power transistor devices 21, as shown, or elsewhere. The heat spreader further diffuses the heat created by operating the power transistor devices 21 and reduces the maximum temperature in the compound power transistor devices 10.

In certain embodiments, at least one of the power transistors 20 is micro-transfer printed, or otherwise disposed, from the power transistor source wafer 60 to the first semiconductor substrate 42 or to a layer formed on or over the first semiconductor substrate 42 over a sacrificial portion 66. A power transistor 20 or power transistor device 21 including at least one power transistor 20 can be disposed over each sacrificial portion 66 and attached to the anchors 64 by one or more tethers 62 over the sacrificial portion 66. The encapsulation layer 24 (as shown in FIG. 7) can be formed by providing dielectric materials, such as oxides or nitrides over the power transistor 20 and electrodes 26 and can make up at least a portion of the tethers 62. The tethers 62 can be formed by etching the sacrificial portions 66 to form one or more tethers 62 connecting the power transistor 20 or power transistor device 21 to the anchor 64, thereby providing a compound power transistor device 10 that can be micro-transfer printed to another substrate, for example a destination substrate 70, using a stamp as described above.

In a further method of the present invention, an electronic circuit 46 is formed on or in the first semiconductor substrate 42. The electronic circuit 46 can be electrically connected to the power transistor 20, for example with metal wires using photolithographic methods. The electronic circuit 46 can include one or more layers on, in, or over the first semiconductor substrate 42. The layers can comprise one or more of an electrical insulator, a patterned electrical insulator, a dielectric layer 24, a patterned dielectric layer 24, an electrical conductor, a patterned electrical conductor, a transistor, a resistor, a capacitor, or a diode. In some embodiments, as shown, the power transistors 20 or power transistor devices 21 can be micro-transfer printed onto or over at least a portion of the electronic circuit 46.

In a further method of the present invention, a device substrate other than the first semiconductor substrate 42 is provided on which the at least one power transistor 20 is micro-transfer printed or an encapsulation layer 24 is provided over the power transistor 20. The device substrate or encapsulation layer 24 form at least a portion of a tether 62 or a tether 62 comprises a portion of the device substrate or encapsulation layer 24. The sacrificial portions 66 are etched to form tethers 62 connecting the compound power transistor device 10 to the anchor 64. The sacrificial portion 66 can be a designated portion of an anisotropically etchable crystal, such as a crystalline semiconductor or a crystalline compound semiconductor, a portion that is differentially etchable from the first or second semiconductor materials, for example an oxide or nitride material, or a gap between the second semiconductor substrate 22 and the power transistor source wafer 60.

According to some embodiments of the present invention, and as illustrated in FIGS. 3 and 5, a compound power transistor system includes a destination substrate 70 and a compound power transistor device 10 micro-transfer printed onto the destination substrate 70 or layers formed on or over the destination substrate 70. A method of making a compound power transistor system comprises providing a destination substrate 70 and micro-transfer printing a compound power transistor device 10 from a compound power transistor device source wafer 61 onto the destination substrate 70 or layers formed on or over the destination substrate 70.

A power transistor system comprises a destination substrate 70 and one or more power transistors 20 or power transistor devices 21 micro-transfer printed onto the destination substrate 70 or layers formed on or over the destination substrate 70. A method of making a power transistor system, comprises providing a destination substrate 70 and micro-transfer printing a power transistor 20 or power transistor device 21 from a power transistor source wafer 60 to the destination substrate 70 or layers formed on or over the destination substrate 70.

Figure 9:
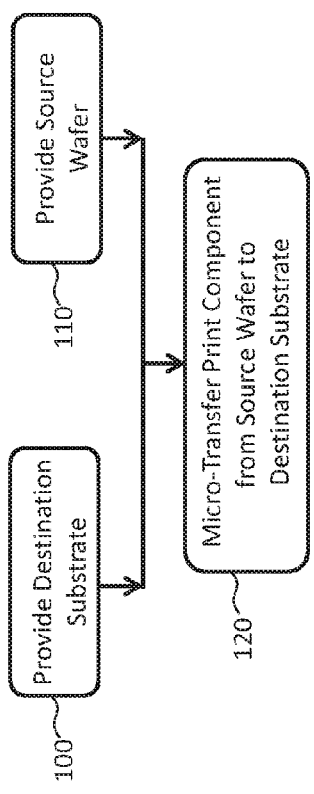
FIG. 9 and FIG. 10 are flow diagrams illustrating methods of the present invention.

In general and referring to the illustrative embodiment of FIG. 9, a power transistor system is made by providing a destination substrate 70 in step 100. A source wafer having one or more micro-transfer printable devices, for example power transistors 20, power transistor devices 21, or compound power transistor devices 10, are provided in step 110. In step 120, the micro-transfer printable devices are micro-transfer printed to the destination substrate 70 using a stamp. In an additional step, an adhesive layer 44 is coated or laminated on the destination substrate 70, for example by spin or curtain coating. Connection pads 48 can be formed on the destination substrate 70 and electrically connected with electrical wires, such as patterned metal traces, for example using photolithography.

Figure 10:
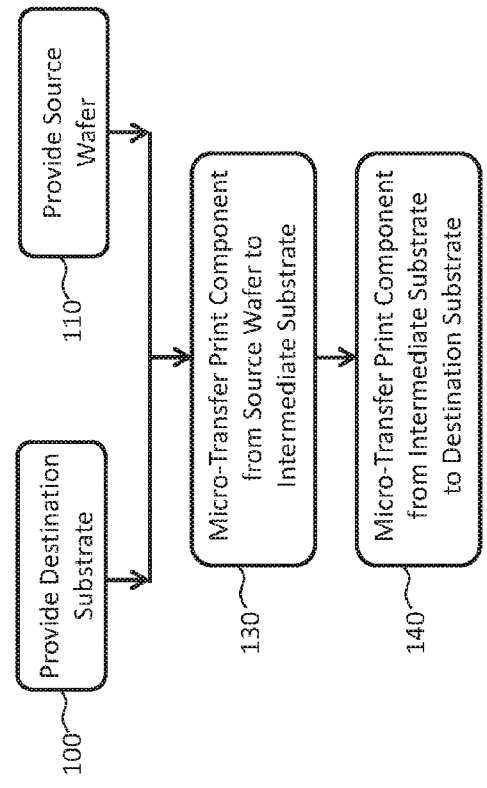

In some embodiments, as illustrated in FIG. 10, a power transistor system is made by providing a destination substrate 70 in step 100. A source wafer having one or more micro-transfer printable devices, for example power transistors 20, power transistor devices 21, or compound power transistor devices 10, are provided in step 110. The micro-transfer printable devices are micro-transfer printed to an intermediate substrate in step 130. The intermediate substrate can be larger than the source substrate and can have a size on the same order of magnitude as the destination substrate 70. From the intermediate substrate, the devices or compound devices are printed, for example micro-transfer printed or disposed using pick-and-place techniques, onto the destination substrate 70 in step 140. This method enables the transfer of larger numbers of micro-transfer printable devices to be transferred at a time to the destination substrate 70 when the micro-transfer printable devices are spatially far apart on the destination substrate 70.

A first or second semiconductor substrate 42, 22 is any substrate in which active electronic circuits 46 and active electronic elements including semiconductor devices such as transistors, diodes, light-emitting diodes, diode lasers, photodiodes, or phototransistors can be formed, for example silicon substrates or III-V semiconductor substrates. The first or second semiconductor substrates 42, 22 can also include passive electronic circuits 46, such as conductors, resistors, and capacitors. A passive electronic circuit 46 can include only patterned electrical conductors. The first or second semiconductor substrates 42, 22 can include semiconductor material that can be crystalline material such as crystalline silicon suitable for high-performance electronics. The first semiconductor substrates 42 can include one or more layers of material that are not semiconductor material formed on, in, or over the semiconductor material between the semiconductor material and the power transistor 20, for example insulators, patterned insulators, dielectrics, patterned dielectrics, or patterned electrical conductors, and that can be used to form passive electronic devices such as capacitors and resistors and planarizing, electrically insulating, or protective layers.

In embodiments of the present invention, the first semiconductor substrate 42 can have two relatively flat and substantially parallel opposing sides and can be any structure having a process side suitable for the deposition, processing, and patterning of active and passive electronic structures useful in forming a passive or active electronic circuit 46. Such structures can include transistors, diodes, conductors, capacitors, and resistors and include patterned semiconductor structures, doped semiconductor structures, dielectrics such as silicon oxides and silicon nitrides, and conductors such as aluminum, copper, gold, silver, titanium, tantalum, and tin or alloys of such materials. In some embodiments, the electrodes 26 or other conductors in or connected to the power transistors 20 are copper. For example, photolithographic processes for making integrated circuits can be employed with suitable first semiconductor substrates 42. The first semiconductor substrates 42 can include semiconductor materials such as silicon or compound semiconductor materials composed of two or more elements from different groups of the periodic table such as a III-V or II-VI semiconductor. In some embodiments, the first semiconductor substrate 42 is a crystalline first semiconductor substrate 42 such as a crystalline silicon semiconductor in which circuits, such as CMOS circuits, can be formed using photolithographic processes. In some embodiments, the second semiconductor substrate 22 includes compound semiconductor materials composed of two or more elements from different groups of the periodic table such as a III-V or II-VI semiconductor and is a crystalline first semiconductor substrate 42 such as a crystalline semiconductor suitable for high-performance power transistors 20 made using photolithographic processes.

In particular, the additional layers of material included in the first semiconductor substrate 42 can be located between the first semiconductor material and the power transistor 20 or adjacent to the power transistor 20. The electronic circuit 46 can be an active circuit and can include CMOS transistors. In some embodiments, the electronic circuit 46 includes active elements (e.g., transistors or diodes) electrically connected to the power transistor 20 with passive electrical conductors (e.g., wires) in or on the first or second semiconductor substrate 42, 22, for example to control, provide power to, or receive power from, the power transistor 20.

In embodiments of the present invention, the encapsulation or dielectric layer 24 can be an oxide or nitride, for example silicon oxide, silicon dioxide, silicon nitride, or another insulator. The encapsulation layer 24 can have an extent over the first semiconductor substrate 42 that is greater than the extent of the power transistor 20 over the first semiconductor substrate 42. For example, the area of the encapsulation layer 24 is greater than the extent of the power transistor 20 in a plane substantially parallel to the surface of the first semiconductor substrate 42 on which the power transistor 20 is micro-transfer printed or otherwise disposed. The encapsulation layer 24 can be a chemically etch-resistant encapsulation layer 24, for example silicon nitride. In a some embodiments, the encapsulation layer 24 comprises at least a portion of a tether 62.

As used herein, an etch-resistant material is a material that resists etching by whatever etchant is used to etch the patterned sacrificial layer 68, as discussed further below.

Compound power transistor devices 10 according to the present invention can also include a plurality of power transistors 20A, 20B and the power transistors 20A, 20B can be the same (as shown) or different (not shown). For example, the power transistors 20A and 20B can have different sizes, respond differently to signals having different frequencies, or provide or switch different amounts of power at different voltages or different currents.

In embodiments of the present invention, a power transistor source wafer 60 or compound power transistor device source wafer 61 includes a substrate of substrate material. The substrate material can be a semiconductor or other material such as glass. A patterned sacrificial layer 68 is formed on, over, or in the substrate material or a surface of the substrate material or the substrate. The patterned sacrificial layer 68 defines sacrificial portions 66 that separate anchors 64 between the sacrificial portions 66 of the patterned sacrificial layer 68, for example separating the patterned sacrificial portions 66 in a direction parallel to a surface of the substrate. A chemically selective etch-resistant power transistor source wafer 60 or compound power transistor device source wafer 61 has a chemical selectivity different from the patterned sacrificial layer 68 and is disposed over the patterned sacrificial layer 68 and attached to the anchors 64 by tethers 62 over the patterned sacrificial layer 68. As used herein, an etch-resistant material is a material that resists etching by whatever etchant is used to etch the patterned sacrificial layer 68. Thus, the power transistor source wafer 60 or compound power transistor device source wafer 61 is resistant to whatever etchant is used to etch the patterned sacrificial layer portions 66. A variety of photolithographic methods can be used to make the patterned sacrificial layer 68, the anchors 64, and the tethers 62 that connect the power transistor substrates 22 to the anchors 64.

In embodiments of the present invention, the patterned sacrificial layer 68 is a patterned layer of etchable material formed on or in the substrate or substrate material, for example an oxide layer such as silicon dioxide that can be etched without etching the power transistor substrate 22 or encapsulation layer 26. Alternatively, the patterned sacrificial portion 66 is a defined portion of the substrate material that is anisotropically etchable. For example, the substrate material can be crystalline silicon with a $\{1\ 0\ 0\}$ crystal orientation or a $\{1\ 1\ 1\}$ orientation that enables the substrate material to be anisotropically etched to form gaps in the sacrificial portions 66 and anchors 64 in the substrate without etching the power transistor substrate 22 or encapsulation layer 24. In alternative examples, the substrate material is a compound semiconductor such as GaAs or InP and the sacrificial portions 66 are a defined portion of the substrate material that is anisotropically etchable. In some embodiments, the patterned sacrificial layer 68 defines sacrificial portions 66 that are each a gap between the etch-resistant power transistor substrate 22 and the substrate material. Thus, the gap can be an etched patterned sacrificial layer 68 portion 66 that has been sacrificed, i.e., the material of the sacrificial portion 66 has been removed by etching, so that the power transistors 20 or power transistor devices 21 are ready to be micro-transfer printed to another substrate, for example the first semiconductor substrate 42 of the compound power transistor device 10 or a destination substrate 70.

In some embodiments of the present invention, a compound semiconductor source wafer comprises a wafer of semiconductor material, wherein the semiconductor material is a compound semiconductor, the wafer having a patterned sacrificial layer 68 of the semiconductor material, the patterned sacrificial layer 68 defining separate anchors 64 between sacrificial portions 66 of the patterned sacrificial layer 68, and a device including the semiconductor material formed over each sacrificial portion 66 and attached to the anchors 64 by one or more tethers 62 over the sacrificial portion 66. The device can be a device for generating, controlling or responding to electricity, a device for generating, controlling, or responding to magnetism or magnetic fields, or a device for generating, controlling, or responding to an electrical field. The device can be a power transistor 20 and the compound semiconductor can be GaAs or InP.

Micro-transfer printing techniques suitable for use with devices and methods disclosed herein are described in U.S. Pat. Nos. 8,722,458, 7,622,367 and 8,506,867, the disclosure of which is hereby incorporated by reference in their entirety. Micro-transfer printing using compound micro-assembly structures and methods can also be used with the present invention, for example as described in U.S. patent application Ser. No. 14/822,868, filed Aug. 10, 2015, entitled Compound Micro-Assembly Strategies and Devices, which is hereby incorporated by reference in its entirety. U.S. patent application Ser. No. 14/743,981, filed Jun. 18, 2015, entitled Micro Assembled LED Displays and Lighting Elements, incorporated herein by reference describes micro-transfer printing structures and processes useful with optical transducers 30 of the present invention.

The power transistors 20 are mounted upon, micro-transfer printed upon, or adhered to the first semiconductor substrate 42. As intended herein, to be mounted upon means that separate substrates are separately produced and then brought into proximity and adhered together in some fashion, for example by micro-transfer printing. The power transistor substrate 22 can be, for example, unpackaged bare die so that the power transistor substrate 22 is in direct contact with the first semiconductor substrate 42 or with an adhesive layer 44 that is in direct contact with the first semiconductor substrate 42 and the power transistor substrate 22. To be mounted upon, micro-transfer printed to, or adhered to the electronic circuit 46 or the semiconductor substrate 40 means that the power transistor substrate 22 is mounted upon, micro-transfer printed upon, or adhered to any of the elements of the electronic circuit 46, for example upon a semiconductor layer, a patterned or doped semiconductor layer or structure, a conductor layer or patterned conductor, a dielectric layer, a patterned dielectric layer, a protective layer, or any other element of the electronic circuit 46, layers on the semiconductor substrate 40, or the semiconductor substrate 40.

The electronic circuit 46 is a circuit that includes active or passive components or elements. For example, an active electronic circuit 46 can include a transistor, an amplifier, or a switch. Passive components such as conductors, resistors, capacitors, and inductors can also be included in the active electronic circuit 46. Elements of the active electronic circuit 46 are electrically connected to circuit connection pads 48. The circuit connection pads 48 are portions of the active electronic circuit 46 that are available to make electrical connections with electrical devices external to the active electronic circuit 46, for example such as controllers, power supplies, ground, or signal connections. The circuit connection pads 48 can be, for example, rectangular areas of electrically conductive materials such as the conductors listed above, accessible or exposed to external elements such as wires or conductors. Electrical connections to the circuit connection pads 48 can be made using solder and solder methods, photolithographic processes, or by contacting and possibly penetrating the circuit connection pads with electrically conductive protrusions or spikes formed in or on a device with another substrate separate, distinct, and independent from the first semiconductor substrate 42 and connected to a circuit, for example, as described in U.S. patent application Ser. No. 14/822,864 entitled Chiplets with Connection Posts, the disclosure of which is incorporated by reference herein in its entirety. Alternatively, the compound power transistor device 10 can include connection posts 16 that are printed onto connection pads 48 of a destination substrate 70.

The first semiconductor substrate 42 and the power transistor substrate 22 can take a variety of forms, shapes, sizes, and materials. In one embodiment, the power transistor 20 is thinner than the first semiconductor substrate 42. In some embodiments, the power transistor 20 is thicker than the first semiconductor substrate 42. The first semiconductor substrate 42 can have a thickness less than 20 microns, less than 10 microns, or less than 5 microns. The power transistor substrate 22 can have a thickness less than 10 microns, less than 5 microns, or less than 1 micron. Alternatively, the power transistor substrate 22 can have a thickness greater than 0.5 microns, greater than 1 micron, greater than 2 microns, or greater than 5 microns. Such a variety of sizes can enable highly integrated and small structures useful in a corresponding variety of electronic systems. The power transistor 20 can have a variety of thicknesses, for example 10 nm to 10 microns. The tethers 62 can have a thickness of several nm (e.g., 50, 100, 200, 500, 700, or 800 nm) to a few µm (e.g., 1-5 µm), for example 600 nm to 1.5 µm.

In some embodiments of the present invention the power transistors 20 are chiplets, small integrated structures, for example bare die, that are micro-transfer printed to the first semiconductor substrate 42 and electrically connected using photolithographic materials and methods, or with connection posts 16 and connection pads 48. The integrated compound power transistor device 10 can be subsequently packaged. In various embodiments, the first semiconductor substrate 42 or the power transistor 20 has a width, length, or height from 2 to 5 µm, 5 to 10 µm, 10 to 20 µm, or 20 to 50 µm. Such small substrate elements provide a high degree of integration and material utilization and consequently reduced manufacturing costs and improved performance. The integrated assembly can be a surface-mount device.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In some embodiments, a first layer on a second layer can include another layer there between. Additionally, "on" can mean "on" or "in." As additional non-limiting examples, a patterned sacrificial layer 68 or sacrificial portion 66 is considered "on" a substrate when a layer of sacrificial material or sacrificial portion 66 is on top of the substrate, when a portion of the substrate itself is the patterned sacrificial layer 68, or when the patterned sacrificial layer 68 or sacrificial portion 66 comprises material on top of the substrate or a portion of the substrate itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross-section line
10 compound power transistor device
16 connection post
20, 20A, 20B, 20C, 20D power transistor
21 power transistor device
22 second semiconductor substrate/power transistor substrate
24 encapsulation layer/dielectric layer
26, 26A, 26B, 26C electrode
28 fractured tether
42 first semiconductor substrate
44 layer of adhesive/adhesive layer
46 electronic circuit
48 connection pad
50 heat spreader
60 power transistor source wafer
61 compound power transistor device source wafer
62 tether
64 anchor
66 sacrificial portion
68 patterned sacrificial layer
70 destination substrate
82 via
86 substrate
100 provide destination substrate step
110 provide source wafer step
120 micro-transfer print from source wafer to destination substrate step
130 micro-transfer print from source wafer to intermediate substrate step
140 micro-transfer print from intermediate substrate to destination substrate step

What is claimed:

1. A compound power transistor device, comprising:
    a first semiconductor substrate comprising a first semiconductor material;
    an electronic circuit formed in or on the first semiconductor substrate;
    a second semiconductor substrate comprising a second semiconductor material different from the first semiconductor material, wherein the second semiconductor substrate has an extent over the first semiconductor substrate that is smaller than the first semiconductor substrate; and
    a power transistor formed in or on the second semiconductor substrate;
    wherein the second semiconductor substrate has been micro-transfer printed on and secured to the first semiconductor substrate and the power transistor is electrically connected to the electronic circuit.

2. The compound power transistor device of claim 1, wherein the second semiconductor substrate comprises a fractured tether.

3. The compound power transistor device of claim 1, comprising a layer of adhesive between the second semiconductor substrate and the first semiconductor substrate that adheres the power transistor to the first semiconductor substrate.

4. The compound power transistor device of claim 1, wherein the power transistor is formed in or on a side of the second semiconductor substrate opposite the first semiconductor substrate.

5. The compound power transistor device of claim 1, comprising a plurality of power transistors formed in or on the second semiconductor substrate, or comprising a plurality of second semiconductor substrates, and one or more power transistors formed in or on each second semiconductor substrate, wherein the power transistors are electrically connected in parallel.

6. The compound power transistor device of claim 1, wherein the electronic circuit is at least one of an integrated circuit, an active electronic circuit, and a CMOS electronic circuit.

7. The compound power transistor device of claim 1, wherein the electronic circuit is electrically connected to the power transistor and wherein the electronic circuit is a control circuit or comprises a gate pre-drive circuit.

8. The compound power transistor device of claim 1, wherein the compound power transistor device comprises a layer or structure formed on the second semiconductor substrate that comprises a fractured tether.

9. The compound power transistor device of claim 1, comprising an encapsulation layer formed at least partially on or over the second semiconductor substrate and on a side of the second semiconductor substrate that is substantially non-parallel to the surface of the first semiconductor substrate.

10. The compound power transistor device of claim 1, wherein the first semiconductor substrate comprises one or more layers formed on, in, or over the first semiconductor material and between the first semiconductor material and the second semiconductor substrate.

11. The compound power transistor device of claim 1, wherein the first semiconductor substrate comprises silicon and the second semiconductor substrate comprises a compound semiconductor, a II-VI semiconductor, a III-V semiconductor, or a GaAs semiconductor.

12. The compound power transistor device of claim 1, comprising a plurality of second semiconductor substrates, each of the plurality of second semiconductor substrates comprising a second semiconductor material different from the first semiconductor material and a power transistor formed in or on the second semiconductor substrate; and wherein each second semiconductor substrate has been micro-transfer printed on and secured to the first semiconductor substrate.

13. The compound power transistor device of claim 1, comprising an electrical connection pad on the first semiconductor substrate and one or more electrically conductive connection posts protruding from a side of the second semiconductor substrate electrically connected to the power transistor wherein the one or more connection posts are electrically connected to the connection pad.

14. The compound power transistor device of claim 1, comprising one or more electrically conductive connection posts protruding from a side of the first semiconductor substrate electrically connected to the electronic circuit.

15. A compound power transistor system, comprising:
a destination substrate; and
a compound power transistor device according to claim 1 micro-transfer printed onto the destination substrate or layers formed on or over the destination substrate.

16. The compound power transistor device of claim 1, wherein the electronic circuit is disposed directly beneath the second semiconductor substrate.

17. The compound power transistor device of claim 9, wherein the encapsulation layer extends at least partially on or over the first semiconductor substrate.

18. The compound power transistor device of claim 9, wherein the encapsulation layer comprises at least a portion of a tether.

19. The compound power transistor device of claim 9, wherein the encapsulation layer is chemically etch-resistant.

20. A power transistor source wafer, comprising:
a wafer of substrate material;
a patterned sacrificial layer formed on or in the substrate material, the patterned sacrificial layer defining separate anchors disposed laterally between sacrificial portions of the sacrificial layer; and
at least one power transistor or power transistor device formed over each sacrificial portion and attached to one or more of the anchors by one or more tethers over the sacrificial portion.

* * * * *